United States Patent [19]

Riley

[11] Patent Number: 4,940,935

[45] Date of Patent: Jul. 10, 1990

[54] AUTOMATIC SMD TESTER

[75] Inventor: Bryan R. Riley, San Jose, Calif.

[73] Assignee: Ried Ashman Manufacturing, Santa Clara, Calif.

[21] Appl. No.: 400,563

[22] Filed: Aug. 28, 1989

[51] Int. Cl.⁵ ............................................. G01R 31/02
[52] U.S. Cl. .................................................. 324/158 F
[58] Field of Search ............. 324/158 F, 73 AT, 73 R, 324/73 PC, 158 P; 209/573, 571

[56] References Cited

U.S. PATENT DOCUMENTS

| | | | |
|---|---|---|---|
| 3,651,401 | 3/1972 | Cooney | 324/158 F |
| 3,761,808 | 9/1973 | Ryan | 324/73 R |
| 4,103,232 | 7/1978 | Sugita et al. | 324/158 F |

Primary Examiner—Ernest F. Karlsen
Attorney, Agent, or Firm—Joseph H. Smith

[57] ABSTRACT

Automated apparatus transfers SMDs with leads for contacting mounting pad surfaces of surface mount PCBs from containers to nests on a rotatable dial, such that the nests support the SMDs by the leads without touching the body of an SMD. At a test station an elevator device elevated the nest to place an SMD in the nest in a test socket positioned above the dial so the SMD leads connect to test circuitry through contacts in the test socket. In a preferred embodiment the test socket is the base of a manual insert test socket and the nest performs the function of the lid of a manual insert test socket.

9 Claims, 8 Drawing Sheets

AUTOMATIC SMD TESTER

FIELD OF THE INVENTION

The present invention is in the area of apparatus for testing packaged electronic devices prepared for mounting to circuit boards, and has particular application to surface-mount (SMD) devices.

BACKGROUND OF THE INVENTION

In the manufacture of integrated circuits a finished chip is a quite small, usually rectangular entity with thin-film leads out to the edges from patterned circuitry on the chip. To integrate a chip into a larger circuit scheme it is necessary to connect the thin film-leads to wiring components and conducting traces in the larger scheme. The common circuitry unit for assembly into electronic equipment, such as a home computer, is the familiar printed circuit board (PCB). To be able to mount chips into the circuitry pattern of a PCB, chips are first enclosed in packages in which wire leads connect to the thin-film leads of the chip and protrude from the edges of the package in a usually rectangular pattern. The wire leads are typically round wire. The package typically furnishes several functions, such as protection of the chip from corrosion, abrasion, and shock, and often serves as a heat dissipation device as well.

A chip package furnishes added strength as well for commercial use, and the wire leads are more durable than the thin film leads on the chip itself. The wires typically protrude from the edges of the package in the plane of that flat package and then turn 90 degrees to the plane. This orientation allows the wires to be inserted into pre-prepared holes in a circuit board, in contact with traces on the circuit board to form a pre-planned circuit, and to be soldered or cemented to the traces, with the package describing a low profile.

In the manufacture of packaged chips, it is necessary to test the chips and the integrity of the connections of the chips to the packages. An industry devoted to apparatus for testing and sorting packages automatically has grown up around the high volume production of integrated circuit packages for circuit boards. The machines are generally termed automatic test handler (ATH) machines. These machines bank a supply of packages to be tested, typically with the packages contained in pockets of formed plastic trays. They handle the trays and use pick and place devices to pick packages from tray pockets and place the packages on test equipment. They apply the leads of the packages to test heads, typically inserting the wire leads into sockets in the test heads, which simulate the arrangement of holes on a circuit board, and a test unit performs electrical test on the chip and package. The machines unplug the packages after test and replace the packages in either the original or other trays, sorted according to the results of the test.

More recently circuit boards have been developed that have mounting pads instead of holes for mounting leads from chip packages. These boards are used with special chip packages called surface mount devices (SMDs), and leads from the packages are soldered or cemented to pad surfaces. The boards have several advantages, such as the fact that they are generally less expensive to make, having no holes. The holes have typically required conductive material in the hole, which has been difficult to accomplish, especially as holes have become smaller and more densely located.

FIG. 1 shows a rectangular SMD 11 with a number of leads from each of the four edges. The device of FIG. 1 shows 16 leads along each edge. The number of leads for such devices varies in the industry. Devices with a total of 44, 80, and 100 or more leads are typical. The leads 15 extend from the edges of enclosure 13 in the plane of the generally flat device, turn 90 degrees to provide for height so the deive may be mounted above a circuit board, then turn again 90 degrees leading away from the SMD, forming flattened feet for mounting to pads on a PCB. The SMB of FIG. 1 is known as a Quad Flat Pack (QFP) in the art, and is a geometry that has been favored by Japanese manufacturers. The geometry of the leads of the QFP shown for attachment to circuit boards designed for SMDs is called a gull wing design in the art. Other SMDs have leads in somewhat different shapes, but also generally forming a surface at each lead to contact a surface of a mounting pad on a PCB. The Quad package of FIG. 1 is about 15 mm. square, although there are other sizes for packaging different chips with different numbers of leads.

Automated handlers for device packages with leads that insert into holes in PCBs and can be inserted into test sockets in a similar manner are not useful for SMD packs with gull wing leads or with leads of other shapes that relay on a mounting surface to mate with the surface of a pad. The leads with flat contact surfaces cannot be inserted into sockets designed to straighten and position the leads, called pin strighteners, nor can they be inserted into conventional test sockets, which accomodate round-wire leads. The leads from SMDs have to be presented to test leads making surface contact, and urged into the array of test leads so all of the package leads make contact with test leads. One difficulty with this requirement is that the package edges are unreliable indicators of the location of the leads, and another is that the leads are not all in exactly the same plane at the contact surfaces.

To test SMDs with flat surface leads, such as gull wing leads, manual insert test sockets have been developed. These are test boxes with hinged lids having contacts on the inside to align with SMD leads and pin leads on the back that may be attached to circuit test boards, for example by soldering. FIG. 2 is a perspective view of a typical manual insert test socket 17. The test socket has a base 19 and a lid 21. The base has rows of pins such as row 23 which are arranged in a pattern to present surfaces to contact the gull wing leads of SMD 11. In the socket of FIG. 2 there are four such rows to correspond to the four rows of leads of SMD 11, although for other SMDs the arrangement would be different.

Lid 21 is hinged to the base and a spring 25 tends to hold the lid in the open position shown. To initiate a test an operator places an SMD in the socket so the leads rest on the socket leads. The handling is typically done with a vacuum wand (not shown). The socket base has guide posts 27, 29, 31 and 33 positioned at the corners of the test lead array to guide the SMD into place. The guide posts are replaces to that the angled edges of the guide posts contact the edges of the rows of leads on the SMD rather than any part of the enclosure from which the leads protrude. For example, edge 35 of guide post 31 contacts edge 31 of one of the rows of leads of the SMD. This arrangement avoids the use of any part of the enclosure to guide the SMD leads into contact with the socket test leads.

When an SMD is in place, the operator closes the lid against spring 25. The lid has protruding ridges 37, 39, 41 and 43 that align in the closed position with the four rows of test leads. For example, ridge 37 aligns with row 23 in the closed position. When the operator closes the lid, a spring-loaded latch 45 pivoted in the lid engages a catch 47 built in to the base to hold the lid closed over the SMD in the socket while a test is accomplished. Ridges 37, 39, 41 and 43 urge the gull wing leads of the SMD against the test leads of the socket, and no other part of the SMD is typically contacted. The base of the test socket has pins from the lower surface (not shown) to plug into or otherwise attach to a test board, which has all the circuitry, switching elements, power supplies and the like that are needed to adequately test the SMD.

Although manual insert test sockets allow SMDs to be tested, there are still some serious drawbacks. One drawback is the fact that the operations are manual, and therefore expensive. Another is that it is difficult for an operator to place an SMD in a manual socket keeping the SMD and the socket relatively parallel. A frequent result is that an SMD is inserted in a slightly cocked position, so the leads are not resting on the test leads on all four rows, so when the lid iis closed, the SMD leads are damaged. Often the damage is so severe that straightening is impractical, and the SMD has to be discarded.

What is needed is an apparatus that allows SMDs to be handled automatically, placed to and retreived from a test socket, so that many more tests may be done at a higher rate without manual intervention, also avoiding human placement errors that damage the SMDs. Such an apparatus also needs to be capable of manipulating tray carriers with pockets to position individual SMDs for placement, and to sort tested SMDs according to test results, placing tested devices in different trays.

SUMMARY OF THE INVENTION

An apparatus is provided for automatically testing SMDs having leads with surfaces for contacting mounting pads on PCBs. The apparatus has nests supported on a carrier such that the nests may be elevated above the carrier and replaced in the carrier, and moved from one position to another by moving the carrier. In a preferred embodiment the carrier is a rotatable dial. The nests support the SMDs by the leads without contacting the body of an SMD. There is a transfer device for picking untested SMDs from storage containers and transfering them to nests on the carrier, and for replacing tested SMDs from the nests to the storage containers.

An elevator device at a test station elevates nests above the carrier and places an SMD in the nest into a test socket positioned above the carrier such that leads of the SMD are connected to test circuitry through contacts in the test socket. Ledges on the nest urge SMD leads onto contacts in the test socket. After tests are performed, the elevator device replaces the nest on the carrier.

In a preferred embodiment the nest has three sides, simplifying the transfer of SMDs to and from nests. The fourth side is made up by an attachment on the elevator device. Also in a preferred embodiment, the test socket is the base of a commercially available manual insert test socket, and the elevator device includes a suction cup for holding an SMD in the nest during testing and for aiding in withdrawing an SMD from the test socket after testing.

The apparatus and method of the invention provides for automating testing of SMDs that have lead configurations for contacting pad surfaces of PCBs, where such leads make insertion into hole patterns for testing difficult or impossible. By automation, throughput is increased over previously manual methods, and positioning and testing is more repeatable and accurate.

DESCRIPTION OF THE PREFERRED EMBODIMENTS

Figure 1:
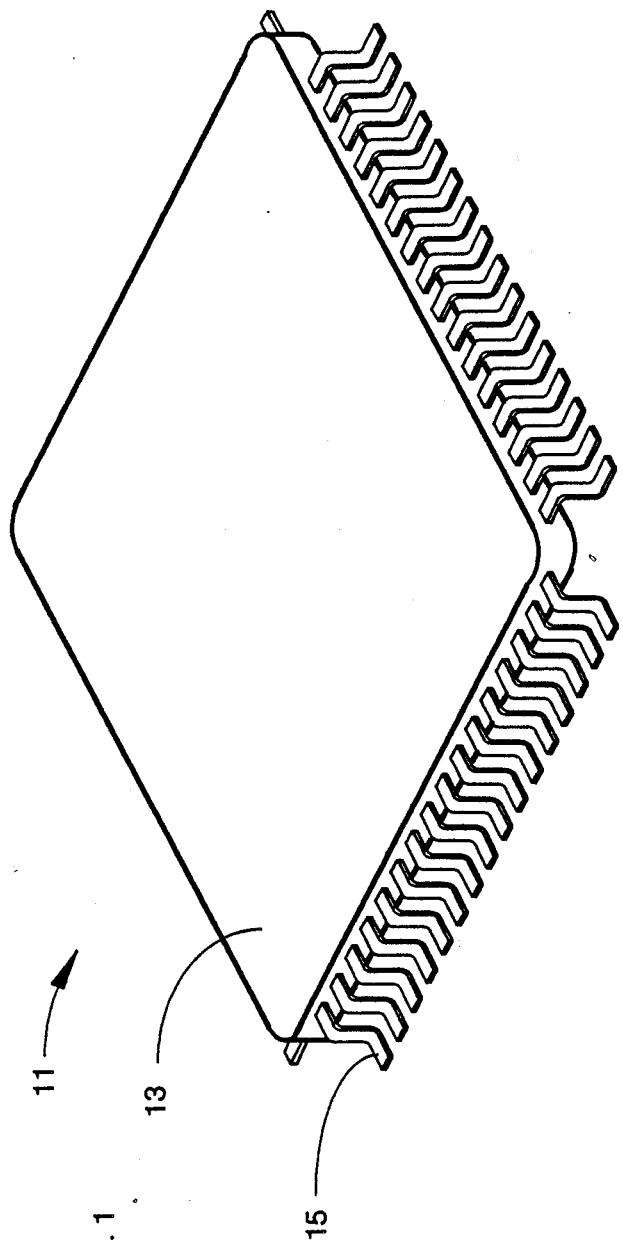
FIG. 1 is a perspective view of an SMD with gull wing leads.
Figure 2:
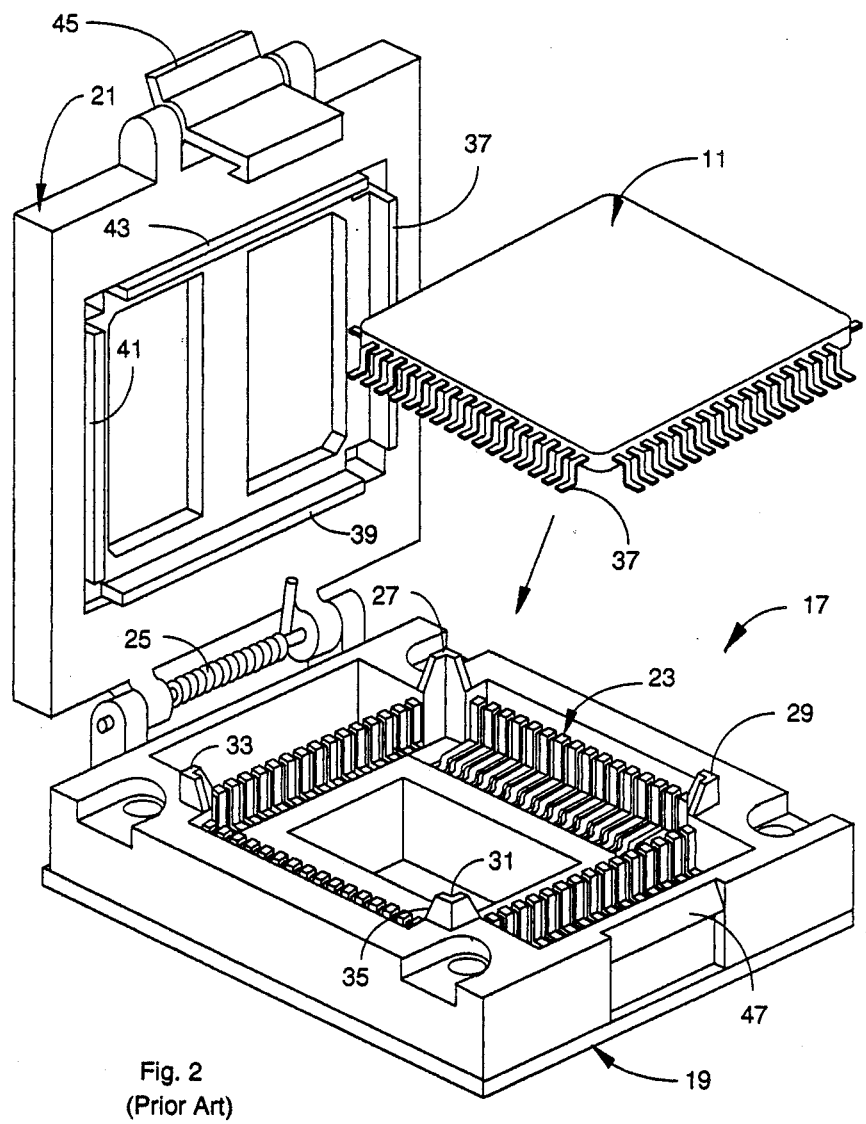
FIG. 2 is a perspective view of a manual insert test socket of the prior art.
Figure 3:
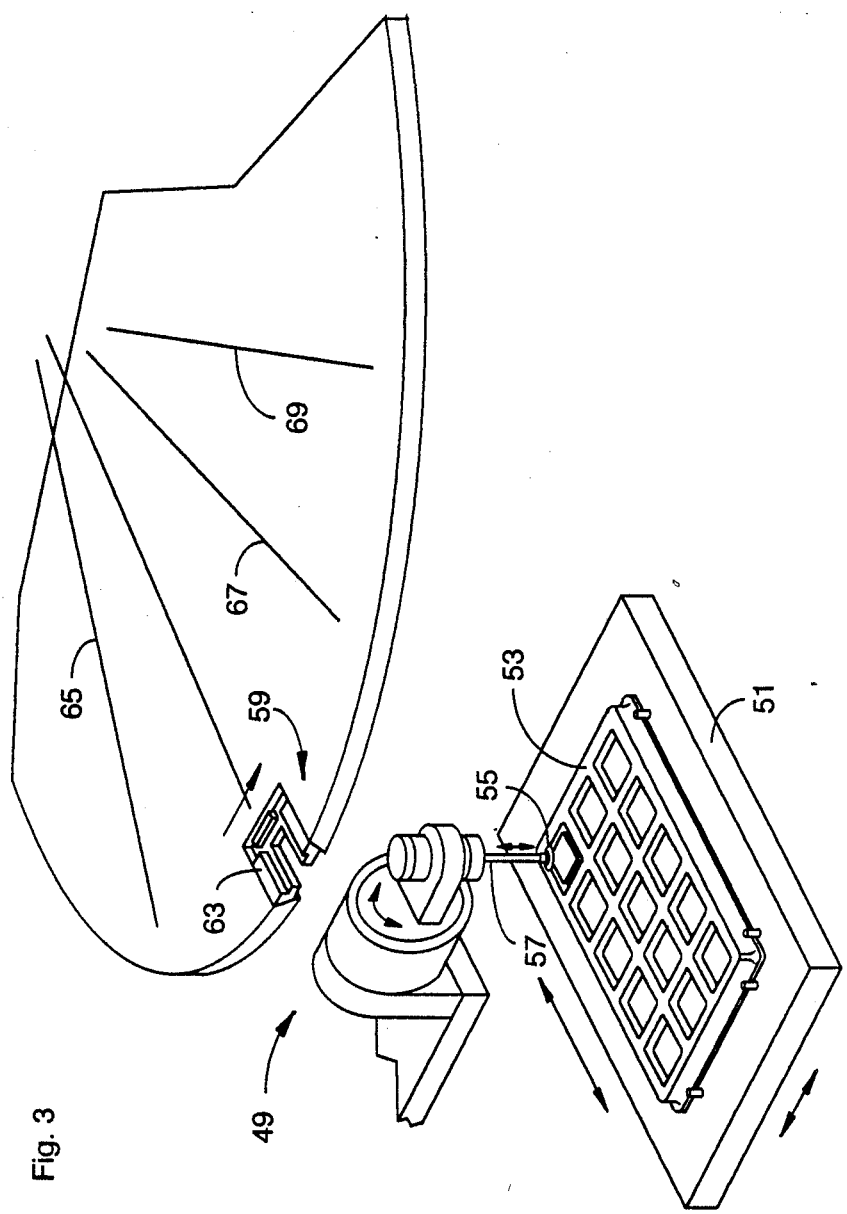
FIG. 3 is a perspective view of a pick-and-place transfer and other elements of a preferred embodiment of the invention.
Figure 4:
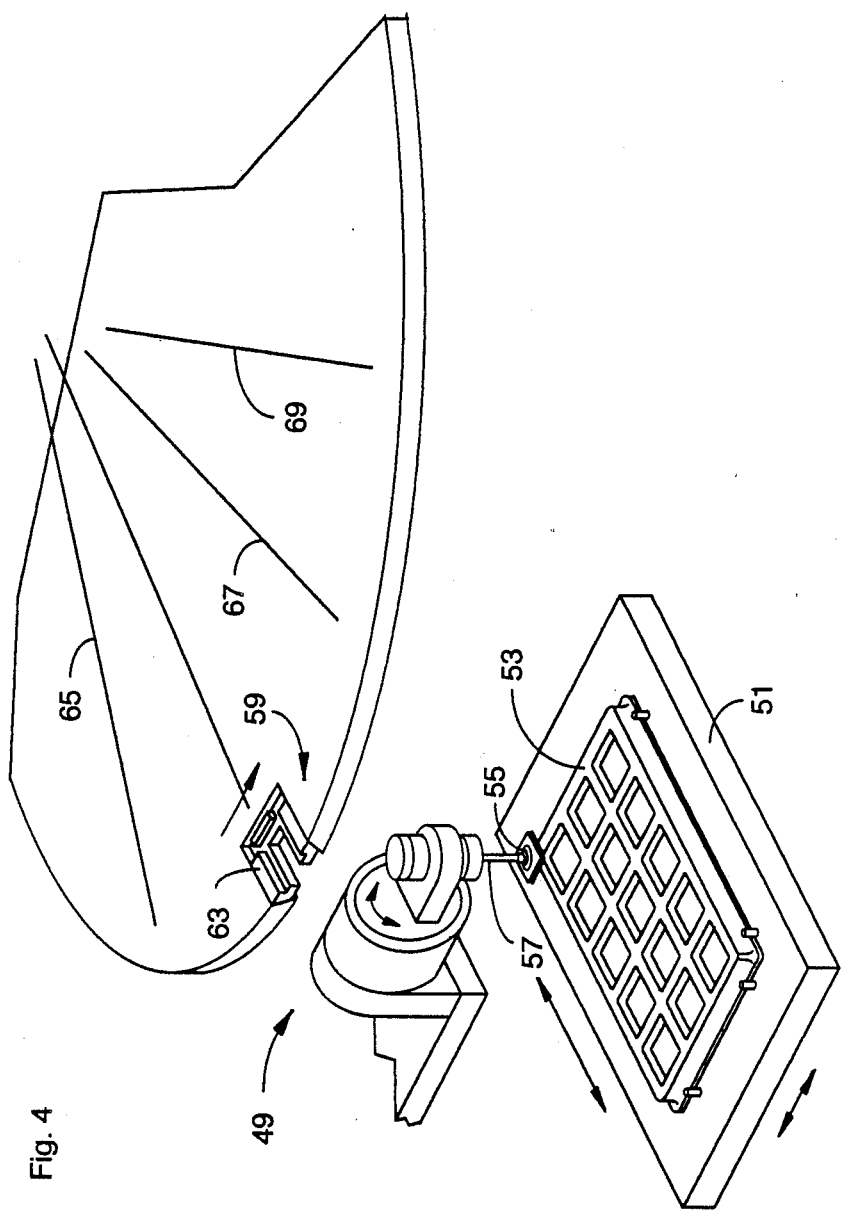
FIG. 4 is the same view as FIG. 3, except the transfer has picked up an SMD.
Figure 5:
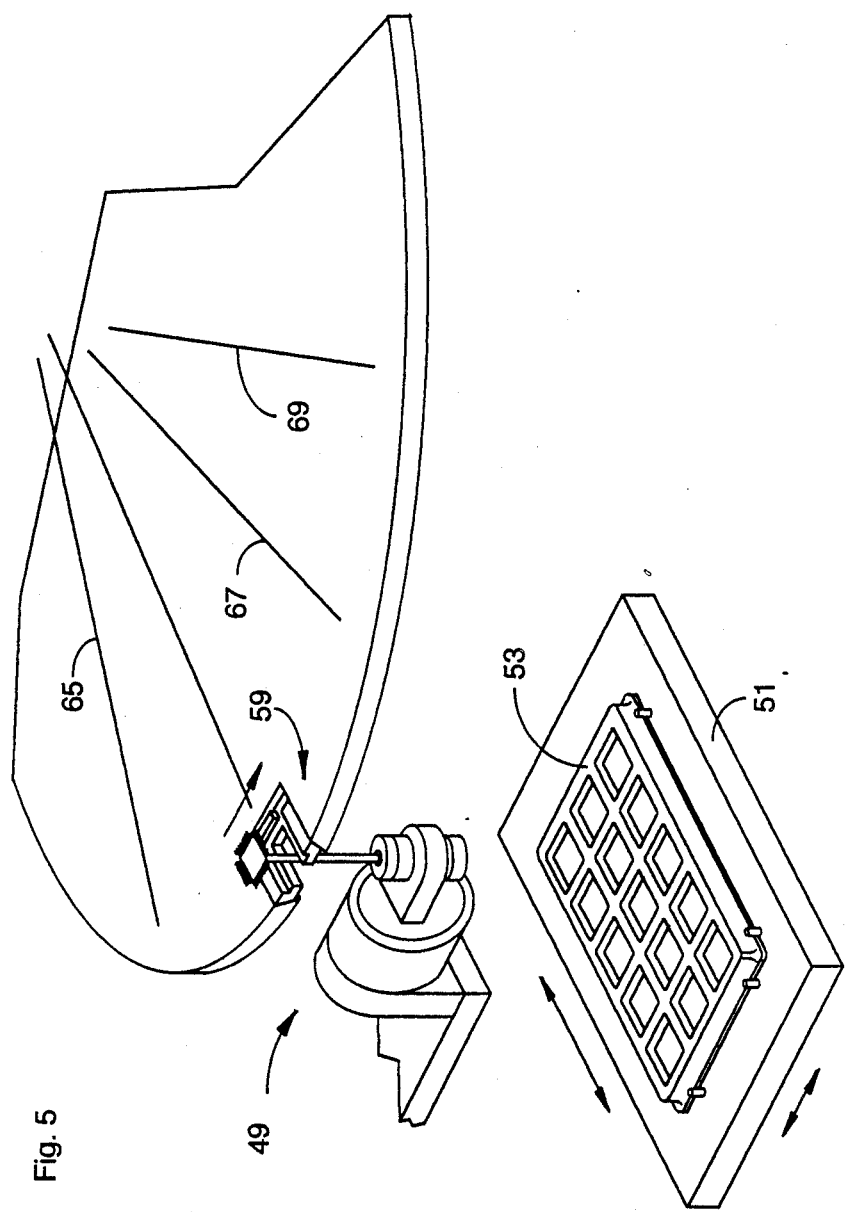
FIG. 5 is the same view as FIG. 4 except that the transfer has rotated to place the SMD above a nest.

FIG. 3 is a perspective view of a load station of an automated apparatus according to a preferred embodiment of the invention. A pivoting pick-and-place device 49 at the load station picks SMDs from pockets of trays such as tray 53 that are supported on an X-Y stage 51. The stage is driven in the directions of the length and the width of a tray by mechanisms not shown to align pockets of a tray with the position directly under the pick-and-place device. When a pocket is aligned, the pick-and-place device extends and vacuum is applied to a vacuum pickup with a vacuum cup 55 to pick up an SMD from the tray. As the pickup retracts the SMD is removed from the tray. FIG. 4 shows the same view as FIG. 3, but with an SMD lifted from the tray. The pick-and-place device rotates after pickup so that shaft 57 passes through the open side of an inner nest 63 supported in a nest position 59, which is one of several nest positions arranged around a rotatable dial 61 (often temed a carousel in the art). The rotation of the pick-and-place device takes place while the dial is stationary. As the device rotates, shaft 57 extends again, so after rotation the SMD is positioned above nest position 59 with the gull wing leads facing upward. FIG. 5 is again the view of FIG. 3, except with an SMD held on cup 55 above the nest after rotation of the pick-and-place device and extension of shaft 57.

Figure 6:
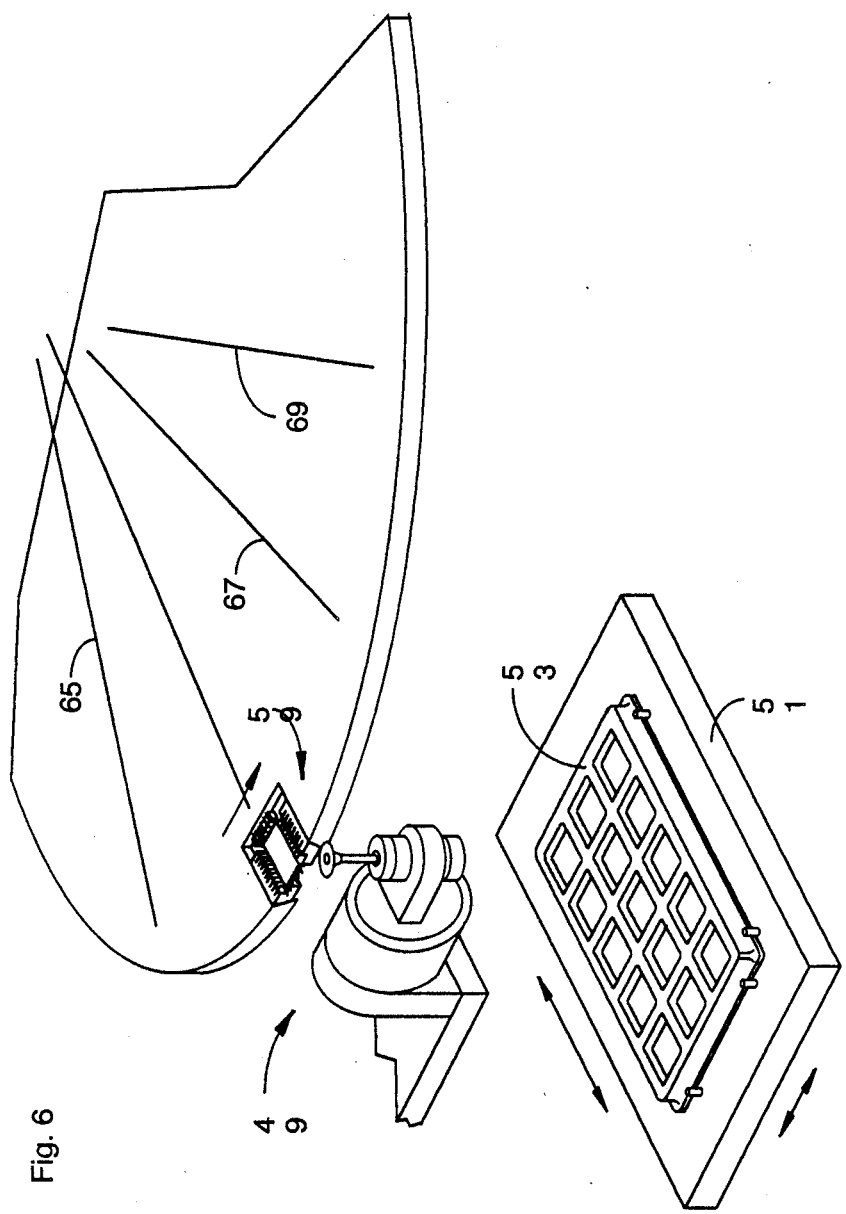
FIG. 6 is the same view as FIG. 5 except the transfer has retracted to place the SMD in the next.

To place the SMD on the dial in nest 63 shaft 57 retracts again and the vacuum to cup 55 is switched off as the SMD is placed in the nest. FIG. 6 shows the SMD in the nest with the pickup retracted. The pickup then rotates back to the tray stage, where the stage may be moved to align another pocket with the pickup to transfer another SMD to another nest on the dial after the dial rotates. The vacuum cup also serves as a sensor to detect an SMD in a pocket of the tray prior to transfer. There are nest positions on the dial at rotary positions indicated by lines 65, 67, and 69, and at other positions on the dial in the preferred embodiment, although they are not shown in FIG. 3. Inner nest 63 and other inner nests at other positions on dial 61 are supported by the dial in cutouts such that the inner nest may be lifted upward from the dial. An SMD transferred to the dial is placed in an inner nest contacting the inner nest only by the gull wing leads, not by the enclosure.

There are in the art of automatic transfers, a large number of different devices that will serve to accomplish the transfer from a tray pocket to a dial or other carrier device, and a similarly large number of X-Y stage drives that are suitable for aligning tray pockets with a pick-and-place device. The devices described and the rotary dial are convenient for the transfer purposes in the preferred embodiment. It is not always necessary, for example, that one side of the inner nest by open, as in the preferred embodiment. There are pick-and-place devices that can load such devices to a closed nest, and these are especially useful if devices are stored in trays with the leads already extending upward.

Figure 7:
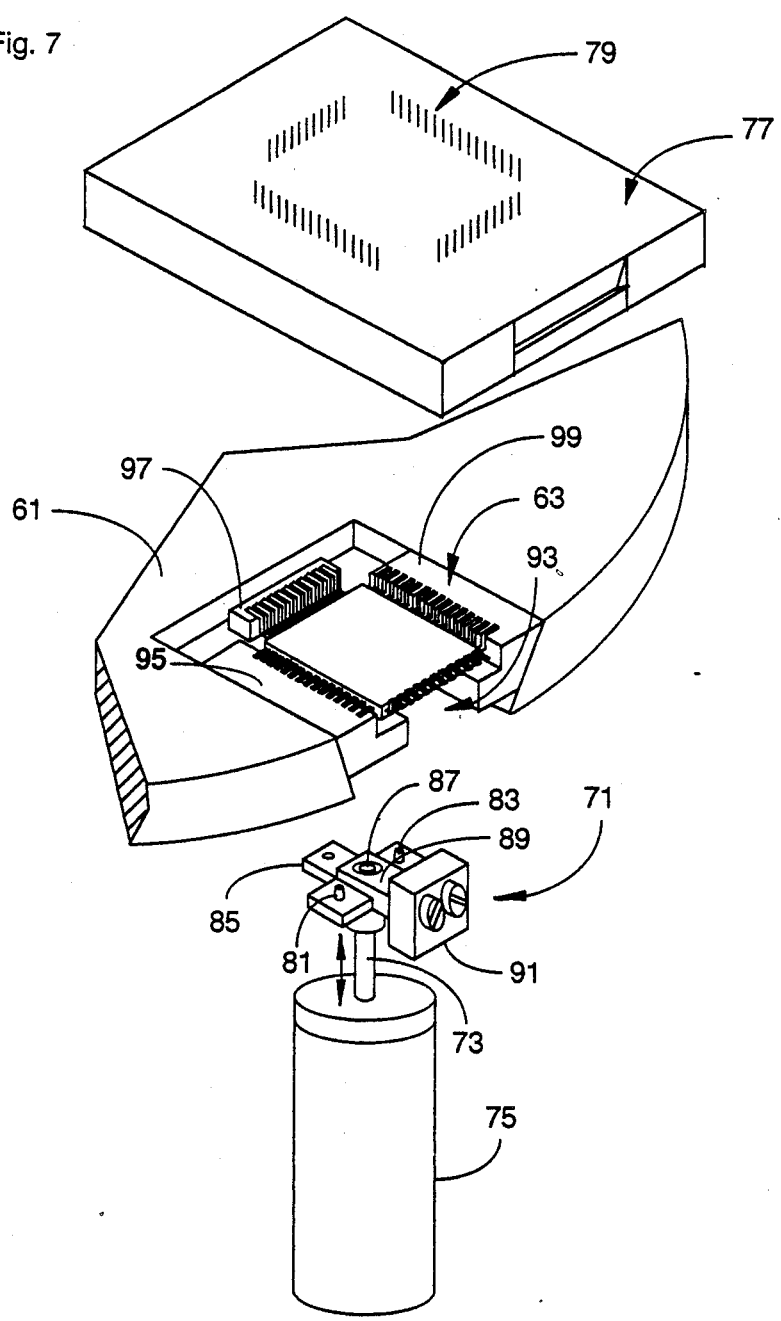
FIG. 7 is a perspective view of a test station in the preferred embodiment.

FIG. 7 shows a view at a test station on dial 61 in the preferred embodiment. The test station is 90 degrees from the load station shown in FIG. 3, although it could be at another position on the dial. It is best that the test station be at a point relative to the rotatable dial such that while an SMD is being loaded at the load station described by FIG. 3, a test may be performed at the test station. At the test station an engagement nest 71 is supported on a shaft 73 of a cylinder 75. The cylinder is supported on a frame member of the apparatus (not shown) and is also guided so that when shaft 73 extends nest 71 does not rotate relative to an inner nest 63 on dial 61.

At the test station there is a test socket 77 with the cavity of the socket facing downward toward a dial nest position aligned at the test station when the dial is not rotating. The test socket in the preferred embodiment is the base of a manual insert test socket as described above. The test socket base is plugged into a test board carried on a structure attached to the frame of the apparatus, although the board and support structure are not shown in FIG. 7 so that an out-pin array 73 of the test socket may be seen. The pins, as previously described, are for connecting test leads of the socket to the testing circuitry of the test board.

At the test station an SMD previously loaded to an inner nest 63 on dial 61 is presented for testing. To position the SMD for test, shaft 73 extends bringing engagement nest 71 into contact with inner nest 63. The engagement nest has locating pins 81 and 83 that insert into corresponding holes (not shown) on the underside of inner nest 73. Extension 85 helps to support the inner nest. A soft rubber vacuum cup 87 extends above surface 85 of the engagement nest and switching vacuum to the cup senses the presence of an SMD in the inner nest and helps to hold the SMD in the nest if an SMD is present. Because the cup is relatively soft, an SMD in the inner nest may still move a small amount to locate when inserted into the test socket.

After the inner nest is engaged and lifted above the support position on the dial, shaft 73 continues to extend, inserting the inner nest and the SMD into the test socket. Engagement nest 71 has an attachment 91 that aligns in opening 93 of inner nest 63 at engagement and forms the fourth side of a four-sided support for the four sets of gull wing leads extending from the four sides of the quad pack SMD. Attachment 91 is needed only in the case of an open-sided inner nest, as in the preferred embodiment. It is not necessary for a four-sided inner nest. Attachment 91 and ridges 95, 97 and 99 of inner nest 63 then serve the purpose of the four ridges described for the lid of the manual insert test socket described above. Attachment 91 and ridges 95, 97 and 99 are the only contacts to the SMD other than the soft vacuum cup that allows movement for alignment.

Figure 8:
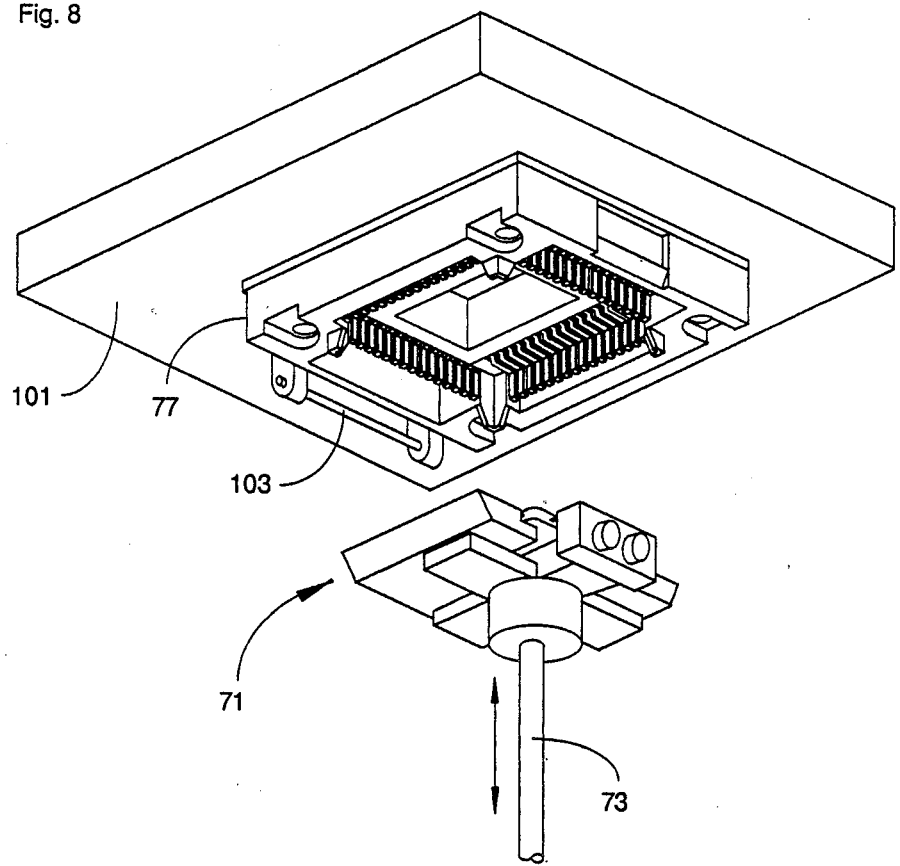
FIG. 8 is another perspective of the test station from a different angle.

FIG. 8 is a view of engagement nest 71 at the test station after engaging an inner nest with an SMD and shows the test apparatus including test socket 71 from below. Test socket 71 is shown attached to a support board 101 upon which a circuit test board (not shown) is mounted. The removable mounting allows test sockets of other sizes to be mounted and circuit test boards of different kinds to be incorporated as well. Similarly, the nest support positions on the dial in the preferred embodiment will support inner nests of differeing sizes and designs so SMDs of various descriptions and geometries may be tested without lengthy changeover time. For SMDs too large to be accomodated in the preferred embodiment, other embodiments may be provided to test them. For example, in an alternative preferred embodiment, a second nest insert, larger than the insert for supporting the SMD, supports the first insert. The larger insert may be changed to accomodate nest inserts for SMDs of various sizes and shapes, without the need to change the dial plate itself. Another alternative, of course, is to change the dial plate for different SMDs to be tested.

As the inner nest enters the test socket, the ends of the rows of gull wing leads of an SMD in the inner nest contact the guides at the four corners of the array of test leads in the test socket, and the SMD is guided into place without reference to the enclosure body of the SMD. The action is the same as with a manual insert test socket with an operator closing the lid. The dial is held stationary and shaft 73 is kept extended while testing is accomplished, then shaft 73 is retracted and the inner nest is returned to the nest support position on the dial. I some cases an SMD tends to stick in a manual insert test socket. In the preferred embodiment vacuum cup 87 aids in removing the SMD from the test socket. In the preferred embodiment hinge pin 103 is retained so that service persons may attach a lid from a mannual insert socket to perform set-up, preliminary tests, and to initially test test boards before automatic testing.

After testing, SMDs are unloaded at the station shown in FIG. 3 where SMDs are loaded to the dial for testing. There may be several categories of test result, depending on the SMD being tested and the test criteria that are programmed to the control system of the testing machine. For example, some SMDs may be categorized as scrap, or discards, as a result of tests performed, while others may be judged repairable. Others may pass all the tests conducted, and be deemed ready for packaging for sale or delivery to other operations where the SMDs are mounted to surface-mount PCBs. The system control is programmed to remember the disposition of each tested SMD returned to the load-unload station, and SMDs unloaded are placed in specific trays and tray pockets reserved for the specific test results.

It is not required that unloading be done at the same station where SMDs are loaded. It is convenient and expedient to do so in the preferred embodiment because the circuit tests performed at the test station take more time than is needed to unload a tested SMD and to load another for test, including repositioning the tray or trays on the X-Y stage. In applications where the tests are performed more quickly, a separate unloaded station may be provided, similar to the load station described, but at another position on the dial. More than one test station may also be provided on one dial to increase throughput of SMDs during testing.

A person skilled in the art will be aware that there are a number of changes that may be made without departing from the spirit and scope of the invention. The use of a rotatable dial that may be moved to align nests with operating stations for load, test and unload is convenient. There are other ways, such as chain conveyors, that might be employed. There are similarly a very large variety of pick-and-place devices that may accomplish transfers of SMDs to and from the dial or other carrier. The test socket in the preferred embodiment is the base of a manual insert test socket, and other sizes may be incorporated with appropriate changes in the inner nests, trays, and so forth. Test sockets could be manufactured for the purpose as well, without resorting to commercially available test sockets. As already described, there are ather arrangements that might be used for loading, unloading, tray manipulation, and there might be more than one test station as well as more than one load and unload station. Similarly, more than one inner nest may be used for convenience in making changes to test diverse SMDs. There are many other changes that could be made without departing from the spirit and scope of the invention.

What is claimed is:

1. Apparatus for automatically testing SMDs having leads with surfaces for contacting mounting pads on PCBs comprising:
    nest means for carrying said SMDs, said nest means having ledges for contacting said leads such that said nest means supports said SMD by said leads alone without contacting the body of said SMD;
    carrier means for supporting and translating said nest means such that said nest means may be elevated above said carrier means and replaced therein;
    transfer means for picking up said SMDs from storage containers and placing said SMDs in said nest means and for picking up said SMDs from said nest means and replacing said SMDs in said storage containers;
    test socket means positioned above said carrier means for contacting said leads of said SMDs, thereby connecting said leads to circuitry for performing electrical tests on said SMDs; and
    elevation means for engaging said nest means, elevating said nest means above said carrier means and inserting said nest means into said test socket means such that said leads are connected to said circuitry, and for withdrawing said nest means from said test socket means after performance of said electrical tests and replacing said nest means in said carrier means.

2. Apparatus as in claim 1 wherein said nest means has three sides such that said transfer means may pass through the open side to place an SMD in said nest means or to remove an SMD from said nest means.

3. Apparatus as in claim 2 wherein said elevation means comprises an attachment forming a forth side for said nest means when said elevation means is engaged with said nest means.

4. Apparatus as in claim 1 wherein said carrier means comprises a rotatable dial plate.

5. Apparatus as in claim 1 wherein said test socket means comprises a manual insert test socket with the lid removed.

6. Apparatus as in claim 1 wherein said elevation means comprises suction means for contacting and holding said SMDs in said nest means, said vacuum means contacting the body of said SMD.

7. Apparatus as in claim 6 wherein said vacuum means comprises a flexible suction cup.

8. A method of performing an electrical test on an SMD comprising:
    separating the base and lid of a manual insert test socket;
    positioning said base above a carrier means;
    supporting a nest means for said SMD on said carrier means such that said nest means may be elevated above said carrier means and replaced on said carrier means;
    transferring said SMD to be tested to said nest means such that said nest means while supporting said SMD contacts only leads of said SMD;
    translating said SMD in said nest means to a position under said base by moving said carrier means; and
    elevating said nest means to place said SMD into said base such that said leads of said SMD are connected to test circuitry through electrical contacts in said base.

9. A method of performing an electrical test on an SMD comprising:
    positioning a test socket means above a carrier means;
    supporting a nest means for said SMD on said carrier means such that said nest means may be elevated above said carrier means and replaced on said carrier means;
    transferring said SMD to be tested to said nest means such that said nest means wile supporting said SMD contacts only leads of said SMD;
    translating said SMD in said nest means to a position under said test socket means by moving said carrier means; and
    elevating said nest means to place said SMD into said test socket means such that said leads of said SMD are connected to test circuitry through electrical contacts in said base.

* * * * *